(12) United States Patent
Li et al.

(10) Patent No.: US 11,637,563 B2
(45) Date of Patent: Apr. 25, 2023

(54) DECODING CIRCUIT AND CHIP

(71) Applicant: SHANGHAI XINLONG SEMICONDUCTOR TECHNOLOGY CO., LTD., Shanghai (CN)

(72) Inventors: Ruiping Li, Shanghai (CN); Wei Chi, Shanghai (CN); Bin Liu, Shanghai (CN); Jianhu Wang, Shanghai (CN)

(73) Assignee: SHANGHAI XINLONG SEMICONDUCTOR TECHNOLOGY CO., LTD., Shanghai (CN)

( * ) Notice: Subject to any disclaimer, the term of this patent is extended or adjusted under 35 U.S.C. 154(b) by 0 days.

(21) Appl. No.: 17/608,302

(22) PCT Filed: Apr. 19, 2021

(86) PCT No.: PCT/CN2021/088126
§ 371 (c)(1),
(2) Date: Nov. 2, 2021

(87) PCT Pub. No.: WO2021/209067
PCT Pub. Date: Oct. 21, 2021

(65) Prior Publication Data
US 2022/0345153 A1  Oct. 27, 2022

(30) Foreign Application Priority Data
Nov. 6, 2020 (CN) .......................... 202011226719.9

(51) Int. Cl.
*H03M 7/00* (2006.01)
*H03M 7/30* (2006.01)

(52) U.S. Cl.
CPC ............. *H03M 7/007* (2013.01); *H03M 7/60* (2013.01)

(58) Field of Classification Search
CPC ............. H03M 7/00; H03M 7/60; H03M 7/07
See application file for complete search history.

(56) References Cited

U.S. PATENT DOCUMENTS

| 3,665,460 A * | 5/1972 | Murakami | ............. H03K 17/74 |
| | | | 341/138 |
| 11,393,822 B1 * | 7/2022 | Vimercati | ........... G11C 11/2253 |

(Continued)

FOREIGN PATENT DOCUMENTS

| CN | 104283569 A | 1/2015 |
| CN | 106052048 A | 10/2016 |

(Continued)

OTHER PUBLICATIONS

International Search Report, China National Intellectual Property Administration, Application No. PCT/CN2021/088126, dated Aug. 5, 2021, 4 pages.

*Primary Examiner* — Lam T Mai
(74) *Attorney, Agent, or Firm* — Ziegler IP Law Group, LLC

(57) ABSTRACT

A decoding circuit and a chip are disclosed. The decoding circuit includes, connected in a sequence, a charge/discharge unit, a capacitor and a conversion unit. The charge/discharge unit is able to charge and discharge the capacitor, and a ratio of a total time required to transfer any amount of charge into the capacitor to a total time required to transfer the same amount of charge from the capacitor is a predetermined value. The conversion unit is configured to output a third level when a voltage on the capacitor exceeds a predetermined voltage and to otherwise output a fourth level. This arrangement alleviates the computational burden of an MCU, eliminates any adverse effect of noise in a transmitted signal, allows an extended effective transmission distance when using an HBS protocol and is self-adaptive to signals transmitted at different clock rates, thus solving the prob- (Continued)

lems with the prior art including heavy MCU computational burden, a tradeoff between error correction and transmission distance and insufficient adaptiveness to signals transmitted at different clock rates.

10 Claims, 4 Drawing Sheets

(56) References Cited

U.S. PATENT DOCUMENTS

| | | | | |
|---|---|---|---|---|
| 11,502,091 | B1* | 11/2022 | Vimercati | G11C 11/2259 |
| 2004/0141560 | A1* | 7/2004 | Koyasu | H04L 25/0292 |
| | | | | 375/257 |
| 2006/0161744 | A1* | 7/2006 | Fukuda | G11C 7/1012 |
| | | | | 711/154 |
| 2010/0134478 | A1* | 6/2010 | Moon | G09G 3/293 |
| | | | | 345/60 |
| 2016/0049192 | A1* | 2/2016 | Lee | G11C 7/18 |
| | | | | 365/185.03 |
| 2020/0294996 | A1* | 9/2020 | Miyazaki | H03K 17/6871 |
| 2020/0374161 | A1* | 11/2020 | Durairaj | H03K 3/017 |
| 2021/0264844 | A1* | 8/2021 | Kim | G09G 3/3275 |
| 2022/0058143 | A1* | 2/2022 | Brox | G06F 13/1668 |
| 2022/0375940 | A1* | 11/2022 | Vimercati | G11C 11/2255 |

FOREIGN PATENT DOCUMENTS

| | | |
|---|---|---|
| CN | 110266339 A | 9/2019 |
| CN | 210327616 U | 4/2020 |
| CN | 211630454 U | 10/2020 |
| CN | 112039606 A | 12/2020 |

* cited by examiner

DECODING CIRCUIT AND CHIP

TECHNICAL FIELD

The present invention relates to the field of integrated circuit (IC) chips and, in particular, to a decoding circuit and a chip.

BACKGROUND

In air conditioning, security, smart home and other fields, the HBS (Home Bus System) protocol is used for communication between host and slave devices. This protocol is advantageous in supporting both communication and power supply over a twisted pair. That is, twisted pairs can be used for communication and to supply power to connected devices. When used to connect devices, twisted pairs do not have polarity requirements, i.e., allow non-polarity connection, providing great convenience to field installers. However, the use of the current HBS protocol for communication in the prior art has the following three disadvantages.

First, the HBS protocol encodes the high- and low-level signals "1" and "0" as "11" and "01", respectively, and decodes the signals "01" and "11" as "00" and "11", respectively, to derive the original waveform. Typically, the decoding operation is performed by software running on a microcontroller unit (MCU). This uses up some valuable resources of the MCU, imposing stricter requirements on the configurations thereof.

Second, for example, in the field of central air conditioners, an inside unit is usually arranged about 50 m, and sometimes over 200 m, away from an in-line controller. In order to address various needs of practical installations, in the design of such air conditioners, manufacturers usually take into account a transmission range of 500 m. This places stringent requirements on a communication interface chip used for this purpose because a twisted pair connected thereto serves not only as a communication line but also as a power line. Therefore, a longer signal communication and power transfer distance would suffer from heavier interference with signals transmitted in the twisted pair, as well as more significant parasitic capacitance on the twisted pair itself, which can distort the transmitted signals. In this case, it is necessary to identify any interfering signal using the MCU, and any unsuccessful attempt of this operation may lead to an increased bit error rate (BER) or even failure in communication. Thus, there is a limitation in the transmission distance.

Third, signals in different technologies are usually transmitted at different clock rates. Therefore, in order to be able to decode these signals, the MCU must adopt a design that is self-adaptive to the various clock rates. This further aggravates the MCU's computational burden.

To sum up, the signal decoding scheme of the current HBS protocol suffers from the problems of heavy MCU computational burden, a tradeoff between error correction and transmission distance and insufficient adaptiveness to signals transmitted at different clock rates.

SUMMARY OF THE INVENTION

It is just an objective of the present invention to provide such a decoding circuit and a chip that solve the above-described problems with the signal decoding scheme of the current HBS protocol, i.e., heavy MCU computational burden, a tradeoff between error correction and transmission distance and insufficient adaptiveness to signals transmitted at different clock rates.

To this end, the provided decoding circuit is used to decode, in accordance with decoding rules of the HBS protocol, a signal transmitted using the HBS protocol. The decoding rules of the HBS protocol include decoding the signal "01" as "00" and decoding the signal "11" as "11". The decoding circuit includes, connected in a sequence, a charge/discharge unit, a capacitor and a conversion unit.

The charge/discharge unit is configured to charge the capacitor in response to the reception of a first level and to discharge the capacitor in response to the reception of a second level. A ratio of a total time required to transfer any amount of charge into the capacitor to a total time required to transfer the same amount of charge from the capacitor is a predetermined value.

The conversion unit is configured to output a third level when a voltage on the capacitor exceeds a predetermined voltage and to otherwise output a fourth level. The predetermined voltage is equal in magnitude to a voltage on the capacitor resulting from a noise spike in the first level.

Both the first and third levels are low, and both the second and fourth levels are high.

The capacitor is configured to eliminate any adverse effect of noise in a transmitted signal and to be self-adaptive to signals transmitted at different clock rates.

Optionally, the predetermined value may be selected from the range of 0.95-1.05.

Optionally, the charge/discharge unit may be configured to charge the capacitor at a first current, which is a constant current, and to discharge the capacitor at a second current, which is also a constant current.

Optionally, a ratio of the magnitude of the first current to the magnitude of the second current may be in the range of 0.95-1.05.

Optionally, the decoding circuit may further include a first reference unit including a first current mirror for generating a reference current, with the charge/discharge unit including a second current minor, a third current mirror and a fourth current mirror, the first current mirror having an input for receiving the reference current, the first current mirror having a first output coupled to an input of the second current mirror, the second current mirror having an output coupled to an input of the third current mirror, the third current mirror having an output coupled to the capacitor, the first current mirror having a second output coupled to an input of the fourth current mirror, the fourth current mirror having an output coupled to the output of the third current mirror.

Additionally, the third current mirror may be configured to output a current that is 1.9-2.1 times in magnitude the reference current, with the fourth current mirror being configured to output a current, which is 0.95-1.05 times in magnitude the reference current and flows in the same direction as the current from the third current mirror.

Optionally, the charge/discharge unit may be configured to cause the third current minor to operate in response to the reception of the first level to output the current, which then converges with the current from the fourth current minor to form the first current, and to cause the third current minor to stop operating in response to the reception of the second level so that the current from the fourth current minor alone forms the second current.

Optionally, the conversion unit may include a voltage comparison module, the voltage comparison module having a first input for receiving the voltage on the capacitor, the voltage comparison module having a second input for receiving the predetermined voltage, the voltage comparison module configured to output a predetermined signal when the voltage received at the first input is higher than the voltage received at the second input.

Optionally, the conversion unit may further include an output module having an enable terminal coupled to the output of the voltage comparison module, the output module configured to output the third level when the predetermined signal is received at the enable terminal from the voltage comparison module and to otherwise output the fourth level.

Optionally, the decoding circuit may further include a second reference unit for providing the voltage comparison module and/or the output module with a biasing current.

The above objective is also attained by a chip including the decoding circuit as defined above.

Compared with the prior art, in the provided decoding circuit and chip, the charge/discharge unit, the capacitor and the conversion unit are connected in a sequence. The charge/discharge unit is able to charge and discharge the capacitor, and a ratio of a total time required to transfer any amount of charge into the capacitor to a total time required to transfer the same amount of charge from the capacitor is predetermined. The conversion unit is configured to output a third level when a voltage on the capacitor exceeds a predetermined voltage and to otherwise output a fourth level. This design enables signal decoding by taking advantage of the encoding characteristics of the HBS protocol to control charge and discharge cycles of the capacitor, thus alleviating computational burden of an MCU. In addition, it eliminates any adverse effect of noise in a transmitted signal by taking advantage of the behavior of the capacitor that the amount of charge thereon will not experience abrupt changes, allowing an extended effective transmission distance when using the HBS protocol. Further, setting the ratio of charge time to discharge time for the capacitor to a predetermined value imparts self-adaptiveness to signals transmitted at different clock rates. Thus, the problems with the prior art including heavy MCU computational burden, a tradeoff between error correction and transmission distance and insufficient adaptiveness to signals transmitted at different clock rates are solved.

BRIEF DESCRIPTION OF THE DRAWINGS

Those of ordinary skill in the art would appreciate that the following drawings are presented merely to enable a better understanding of the present invention rather than limit the scope thereof in any sense. In the drawings.

Figure 1:
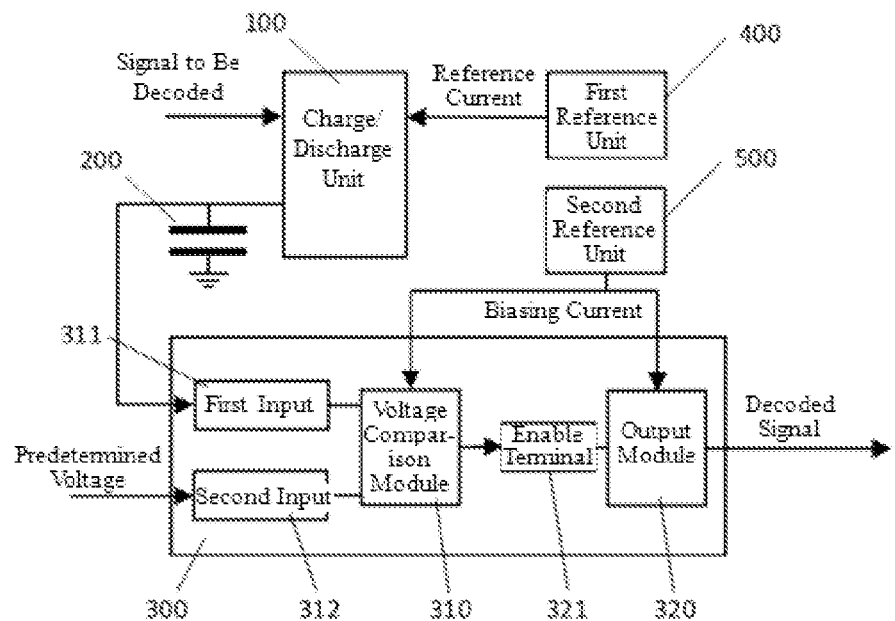
FIG. 1 is a structural schematic of a decoding circuit according to Embodiment 1 of the present invention.

In these figures,
100-charge/discharge unit; 200-capacitor; 300-conversion unit; 400-first reference unit; 500-second reference unit; 600-voltage supply unit;
110-second current minor; 120-third current minor; 130-fourth current minor; 140-transistor; 310-voltage comparison module; 320-output module; 311-first input of the voltage comparison module; 312-second input of the voltage comparison module; 321-enable terminal of the output module; 410-first current minor.

DETAILED DESCRIPTION

Objects, advantages and features of the present invention will become more apparent from the following more detailed description of a few specific embodiments thereof, which is made in conjunction with the accompanying drawings. Note that the figures are provided in a very simplified form not necessarily drawn to exact scale for the only purpose of helping to explain the disclosed embodiments in a more convenient and clearer way. In addition, structures shown in the figures are usually part of actual structures. In particular, as the figures tend to have distinct emphases, they are often drawn to different scales.

As used herein, the singular forms "a", "an" and "the" include plural referents unless the context clearly dictates otherwise. The term "or" is employed in the sense including "and/or" unless the context clearly dictates otherwise. The term "several" is used in the sense of "at least one", and the phrase "at least two" is used in the sense of "two or more". Moreover, the use of the terms "first", "second" and "third" herein is intended for illustration only and is not to be construed as denoting or implying relative importance or as implicitly indicating the numerical number of the referenced item. Accordingly, defining an item with "first", "second" or "third" is an explicit or implicit indication of the presence of one or at least two of the item. The terms "one end" and "the other end", or "proximal end" and "distal end", are generally used to refer to opposing end portions including the opposing endpoints, rather than only to the endpoints. Further, the terms "installation", "connection" and "coupling" should be interpreted in a broad sense. For example, a connection may be a permanent connection, a detachable connection, or an integral connection. It may also be a mechanical connection or an electrical connection. Further, it may be also be a direct connection, an indirect connection with one or more intervening elements, or an internal communication or interaction between two components. Furthermore, when an element is referred to as being disposed on another element, it is typically only meant that the two elements are connected, coupled, mated or geared to each other either directly or indirectly with the presence of intervening element(s). Such reference should not be interpreted as indicating or implying any relative spatial relationship between the two elements. That is, the referenced element may be positioned inside, outside, above, beneath, beside or in any other spatial relationship to the other element, unless the context clearly specifies. Those of ordinary skill in the art can understand the specific meanings of the above-mentioned terms herein according to the specific circumstances.

The core concept of the present invention is to provide a decoding circuit and a chip, which solve the above-described problems with the signal decoding scheme of the current HBS protocol, i.e., heavy MCU computational burden, a tradeoff between error correction and transmission distance and insufficient adaptiveness to signals transmitted at different clock rates.

In the following description, reference is made to the accompanying drawings.

EMBODIMENT 1

Figure 2:
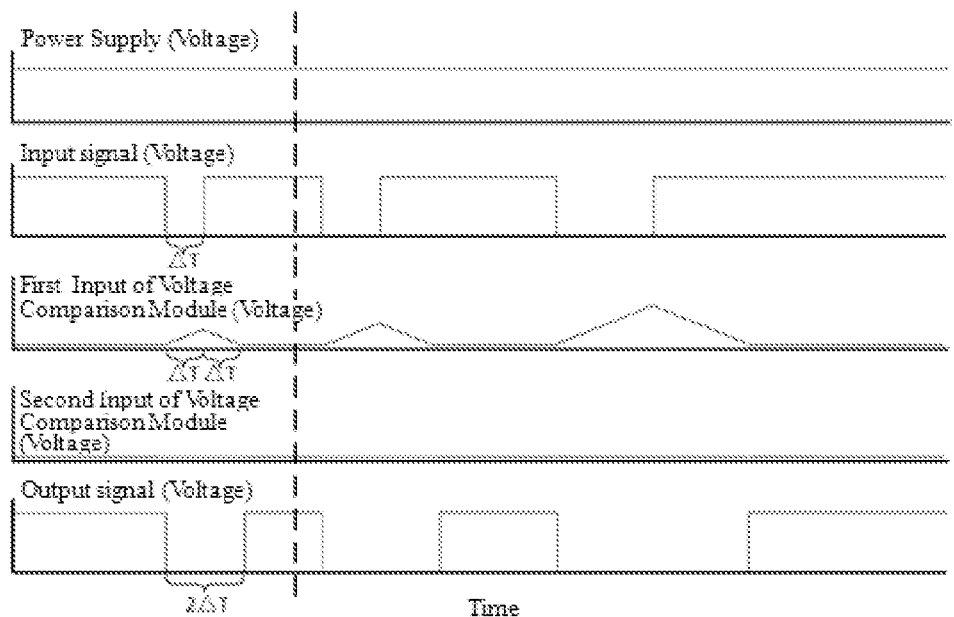
FIG. 2 is a schematic waveform diagram of signals used in the decoding circuit according to Embodiment 1 of the present invention.

Reference is now made to FIG. 1 and FIG. 2, FIG. 1 is a structural schematic of a decoding circuit according to Embodiment 1 of the present invention, and FIG. 2 is a schematic waveform diagram of signals used in the decoding circuit according to Embodiment 1 of the present invention.

As shown in FIG. 1, the decoding circuit provided in this embodiment includes, connected in sequence, a charge/discharge unit 100, a capacitor 200 and a conversion unit 300.

The charge/discharge unit 100 is configured to charge the capacitor 200 in response to the reception of a first level and to discharge the capacitor 200 in response to the reception of a second level. A ratio of a total time required to transfer any amount of charge into the capacitor 200 to a total time required to transfer the same amount of charge from the capacitor 200 is predetermined.

The conversion unit is configured to output a third level when a voltage on the capacitor 200 exceeds a predetermined voltage and to otherwise output a fourth level.

The first level is one of a high level and a low level, while the second level is the other of the high and low levels. The third level is one of a high level and a low level, while the fourth level is the other of the high and low levels.

It would be appreciated that, the phrase "any amount of charge" is intended to refer to an amount of transferred charge that may occur in normal operation. Amounts of transferred charge that exceed the capacity of the capacitor 200 or those that would not occur during normal operation are not necessarily subject to the constraint that the ratio of total charge time to total discharge time is a predetermined value. Circuit schemes with a predetermined ratio of total charge time to total discharge time for any amount of transferred charge that may occur in normal operation and with a non-predetermined ratio of total charge time to total discharge time for any amount of transferred charge that would not occur in normal operation are considered to be within the scope of this application. A total charge time of a charge process is calculated by summing up the durations of all continuous charge periods in the process, with any blank period in the process without the presence of a charge current being precluded. A total discharge time of a discharge process is calculated in a similar way. A complete charge and discharge process starts and ends at the same amount of charge on the capacitor 200, such as zero. An exemplary charge and discharge process is shown in Table 1 below.

TABLE 1

An exemplary charge and discharge process of the capacitor

| Period | Charge/Discharge | Amount of Charge on Capacitor |
|---|---|---|
| T1 | Blank | =0 |
| T2 | Charge | >0 |
| T3 | Discharge | >0 |
| T4 | Blank | >0 |
| T5 | Discharge | >0 |

TABLE 1-continued

An exemplary charge and discharge process of the capacitor

| Period | Charge/Discharge | Amount of Charge on Capacitor |
|---|---|---|
| T6 | Charge | >0 |
| T7 | Discharge | >0 |
| T8 | Discharge | =0 |

Therefore, a total charge time of the exemplary process of Table 1 is calculated as T2+T6, and a total discharge time thereof as T3+T5+T7+T8.

This arrangement offers the following advantages:

First, it offloads the decoding task from an MCU to the dedicated decoding circuit, thus alleviating the MCU's computational burden and dispensing with the need for an associated software program.

Second, it eliminates any adverse effect of noise in transmitted signals by taking advantage of the behavior of the capacitor 200 that the amount of charge thereon will not experience abrupt changes. Even when one or more noise spikes are present in a transmitted signal, the waveform of a signal output from the decoding circuit in response thereto will not be affected (although its pulse width may be somewhat distorted, such distortion will be ignored by a subsequent analog to digital conversion module). Moreover, the elimination of adverse effects of noise in transmitted signals allows an extended effective transmission distance when using the HBS protocol.

Third, the predetermined ratio of charge time to discharge time makes the capacitor 200 self-adaptive to signals transmitted at different clock rates. For example, for a transmitted signal with a pulse width of $\Delta T$, a low level of the signal may be taken as a trigger for initiating charge of the capacitor 200. It may be configured that when the predetermined value is 1, a total time in which the voltage on the capacitor 200 is higher than the predetermined voltage is twice the charge time, enabling the decoding circuit to always convert a pair of consecutive bits into a single bit (of course, in coordination with other logics). In other words, upon another signal with a different frequency (and hence a different pulse width) being input, the decoding circuit will responsively output a signal with a pulse width twice that of the input signal. This allows the decoding circuit to modify its output pulse width for input signals with different frequencies, i.e., be self-adaptive to signals transmitted at different clock rates.

It is to be understood that the predetermined value may vary with actual operating conditions. For example, it may be configured that when the predetermined value is ½, a total time in which the voltage on the capacitor 200 is higher than the predetermined voltage is thrice the charge time, enabling the decoding circuit to always decode a set of consecutive three bits into a single bit (of course, in coordination with other logics). As another example, a special password protocol utilizes data frames each consisting of 8 bits and is designed so that the first bit indicates, when it is a low level, that the subsequent 7 bits represent information encrypted using a first encryption algorithm. Additionally, when the first bit is a high level, it indicates that the subsequent 7 bits represent information encrypted using a second encryption algorithm. In this example, decryption of an input data stream can be simplified by initially processing it with the decoding circuit operating with the predetermined value being set to 1/7 in cooperation with other circuitry.

Preferably, the predetermined value is selected from the range of 0.95-1.05. More preferably, the predetermined value is 1. For ease of understanding, reference is now made to FIG. 2, FIG. 2 is a schematic waveform diagram of the signals in an example of this embodiment, in which both the first and third levels are low. In the example of FIG. 2, an input signal to the decoding circuit can be substantially considered as three low-level pulses with different pulse widths input at different times. Each of these low-level pulses causes variation of a voltage on the capacitor 200 that follows corresponding variation profile in the shape of an isosceles triangle with a bottom side length twice a pulse width of the specific pulse. The three low-level pulses in FIG. 2 are temporally spaced enough for the respective corresponding voltage variation profiles of the capacitor 200 to be separate from and independent of one another. When any adjacent two of the low-level pulses are close to each other, there may be an overlap between the corresponding two isosceles triangles, which may heighten the later isosceles triangle and prolong its bottom side due to incomplete discharge of the capacitor that is charged by the earlier low-level pulse.

There are many methods for precise control of the charge and discharge times. For example, a constant voltage source may be used to charge and discharge the capacitor 200, and other circuit details and parameter of various circuit elements may be determined by reverse inference from the intended results. However, in a preferred implementation, the charge/discharge unit charges the capacitor 200 at a first current, which is a constant current. Moreover, it discharges the capacitor 200 at a second current, which is also a constant current. This arrangement can satisfactorily achieve the intended results simply by adjusting magnitudes of the first and second currents, thus allowing a simplified logic design of the circuit. Further, a ratio of the magnitude of the first current to that of the second current may be selected from the range of 0.95-1.05.

In one implementation, the decoding circuit further includes a first reference unit 400. The first reference unit 400 includes a first current mirror configured to generate a reference current serving as a basis for the charge/discharge unit 100 to configure charge and discharge currents, as described in detail in Embodiment 2 below.

Preferably, the conversion unit 300 includes a voltage comparison module 310. The voltage comparison module 310 has a first input 311 for receiving the voltage on the capacitor 200. The voltage comparison module 310 also has a second input 312 for receiving the predetermined voltage. The voltage comparison module 310 is configured to output a predetermined signal when the voltage received at the first input 311 is higher than that received at the second input 312. It is to be understood that the predetermined signal is one of a high level, a low level, a rising edge and a falling edge. This arrangement allows conversion of information about charge on the capacitor 200 to information that can be easily read and transferred by a subsequent circuit, as part of the function of the decoding circuit. Preferably, the predetermined voltage may be a value slightly higher than 0, which may be determined from both a voltage value of the capacitor 200 resulting from a widest possible noise spike in the first level and an actual line voltage drop across the circuit.

Further, at least one of the first input 311 of the voltage module 310 and the second input 312 of the voltage module 310 is a high-impedance input. This arrangement allows the decoding circuit to have improved response accuracy.

In one implementation, the conversion unit 300 further includes an output module 320. The output module 320 has an enable terminal 321 coupled to an output of the voltage comparison module 310. The output module 320 is configured to output the third level when receiving the predetermined signal from the voltage comparison module 310 at the enable terminal 321. Otherwise, the conversion unit 300 is configured to output the fourth level from the output module 320. This arrangement isolates the voltage comparison module 310 from the external circuitry, thus preventing the external circuit from affecting the voltage comparison module 310 and thus affecting the accuracy of the decoding circuit.

Preferably, the decoding circuit further includes a second reference unit 500. The second reference unit 500 is configured to provide the voltage comparison module 310 and/or the output module 320 with a biasing current. This arrangement results in additional increases in stability of the voltage comparison module 310 and/or the output module 320 and in correctness of the decoding circuit. It is to be understood that the first reference unit 400 and the second reference unit 500 may be either separate units or integrated as a single unit. The former option allows higher flexibility in the arrangement of circuit component, while the latter option allows a reduced number of components. Selection may be made between them according to the actual operation condition, without departing from the scope of this application.

Referring now to the portion of FIG. 2 left to the dashed line, in an exemplary implementation, the decoding circuit operates with the first level ("Input Signal" in FIG. 2) with a pulse width of $\Delta T$ being first received, which charges the capacitor 200 until a maximum amount of charge is transferred to the capacitor (the amount of transferred charge is proportional to the voltage on the capacitor, i.e., "First Input of Voltage Comparison Module (Voltage)" in FIG. 2). After that, the input signal transitions to the second level, initiating discharge of the capacitor 200 for a period of time equal to $\Delta T$ ("First Input of Voltage Comparison Module (Voltage)" in FIG. 2). Within this period of $2*\Delta T$, the voltage on the capacitor 200 (i.e., "First Input of Voltage Comparison Module (Voltage)" in FIG. 2) can be considered as substantially remaining higher than the predetermined voltage (i.e., "Second Input of Voltage Comparison Module (Voltage)" in FIG. 2), so according to the operating principles of the output module 320 as described above, the output module 320 continuously outputs the third level. In the remaining period, since the voltage on the capacitor 200 (i.e., "First Input of Voltage Comparison Module (Voltage)" in FIG. 2) does not exceed the predetermined voltage (i.e., "Second Input of Voltage Comparison Module (Voltage)" in FIG. 2), the output module 320 continuously outputs the fourth level. Assuming the first and third levels are both low and the second and fourth levels are both high, if the input $\Delta T$-wide pulse is a signal indicative of "01" (this pulse lasts for a total period of $2*\Delta T$ and carries two bits each corresponding to a period of $\Delta T$), then a $2*\Delta T$-wide pulse will be output as a signal indicative of "0". If the input $\Delta T$-wide pulse is a signal indicative of "11", then a $2*\Delta T$-wide pulse will be output as a signal indicative of "1". It is to be understood that the waveforms shown in FIG. 2 are nothing but examples and vary with the first, second, third and fourth levels, but the design principles remain the same.

In this embodiment, there is also provided a chip, which includes the decoding circuit as defined above and therefore has the same advantages as discussed above. This chip can be fabricated using a transistor or metal-oxide-semiconductor field-effect transistor (MOSFET) process used in IC fabrication. Those skilled in the art can understand and appreciated how to configure and form other components of the chip based on common general knowledge in the art, and a detailed description thereof is deemed unnecessary and omitted.

EMBODIMENT 2

Figure 3:
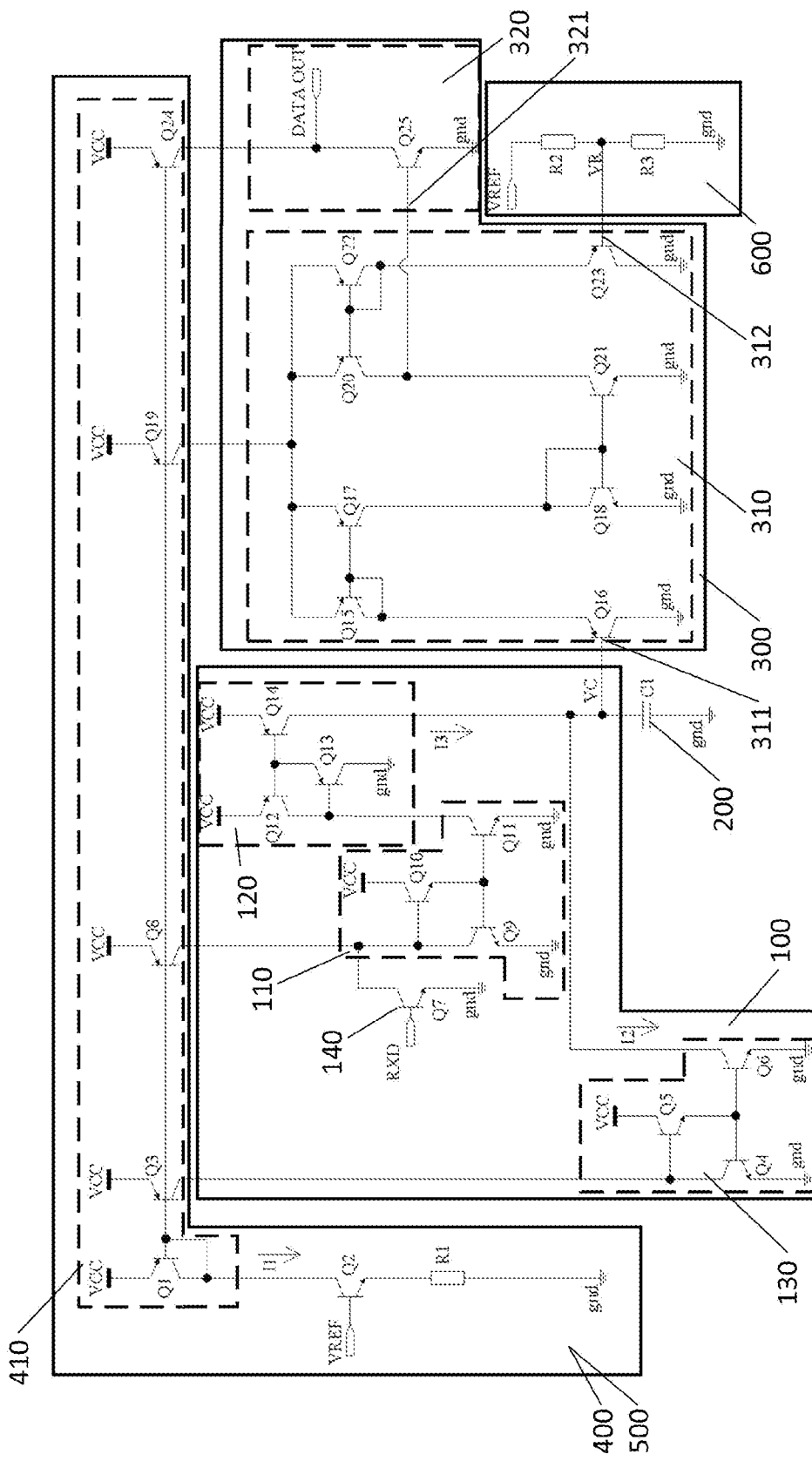
FIG. 3 is a schematic view of a decoding circuit according to Embodiment 2 of the present invention.
Figure 4:
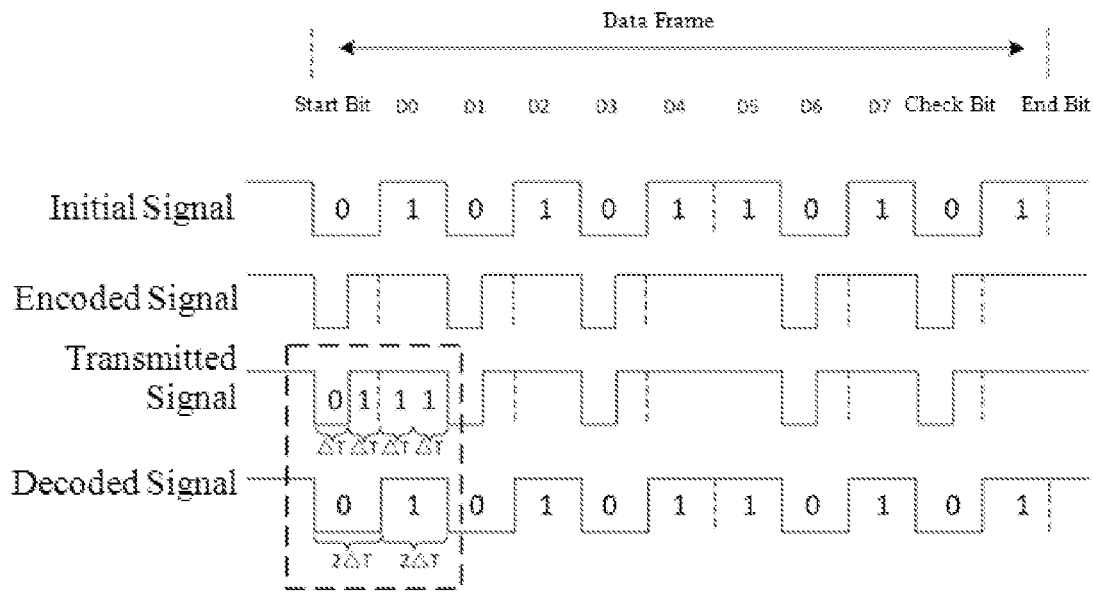
FIG. 4 schematically illustrates an output waveform in response to a transmitted signal without interference from the decoding circuit according to Embodiment 2 of the present invention.
Figure 5A:
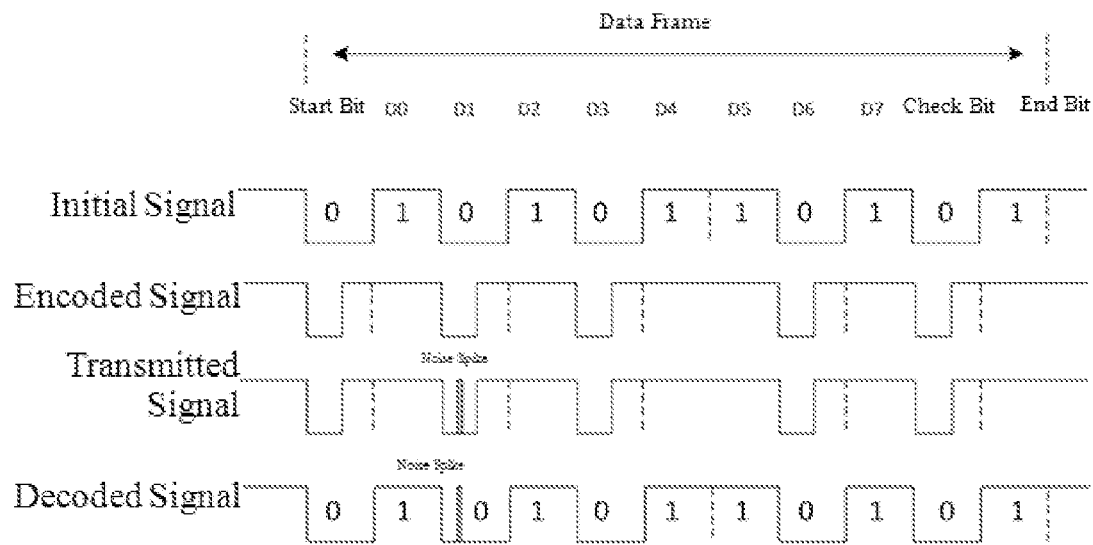
FIG. 5a schematically illustrates an output waveform in response to a transmitted signal with interference from a software-based decoding scheme.
Figure 5B:
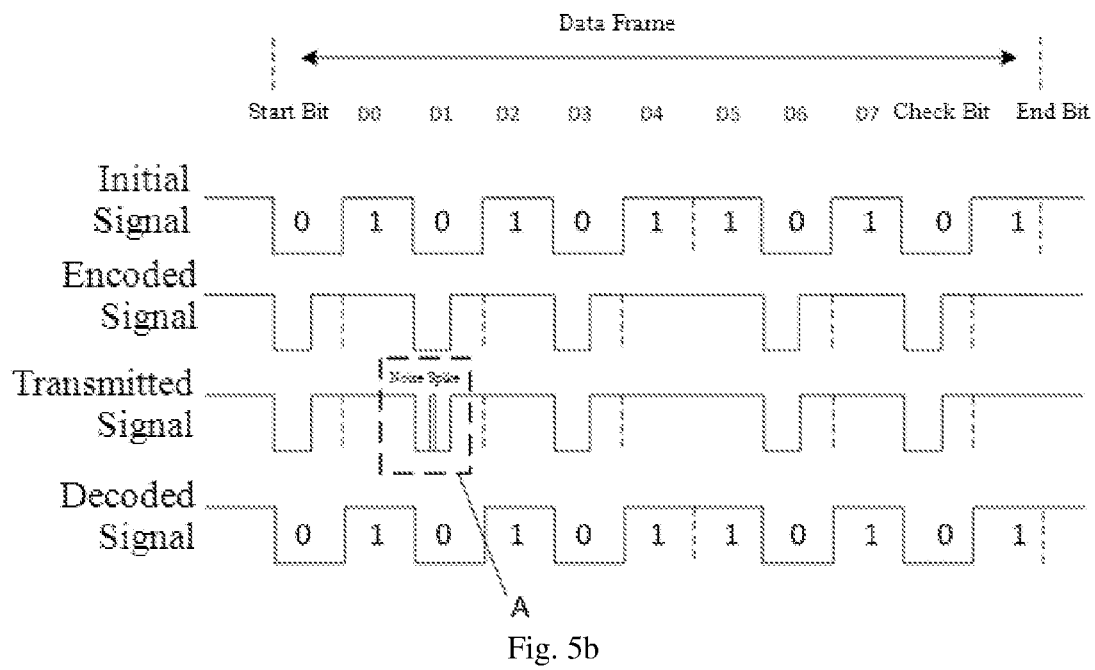
FIG. 5b schematically illustrates an output waveform in response to a transmitted signal with interference from the decoding circuit according to Embodiment 2 of the present invention.
Figure 5C:
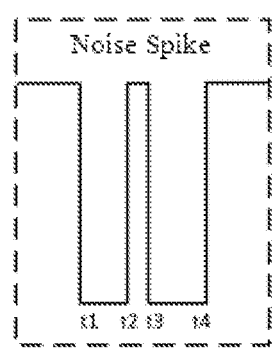
FIG. 5c is a partially enlarged schematic view of portion A of FIG. 5b.

Reference is now made to FIGS. 3 to 5c. FIG. 3 is a schematic view of a decoding circuit according to Embodiment 2 of the present invention. FIG. 4 schematically illustrates an output waveform in response to a transmitted signal without interference from the decoding circuit according to Embodiment 2 of the present invention. FIG. 5a schematically illustrates an output waveform in response to a transmitted signal with interference from a software-based decoding scheme. FIG. 5b schematically illustrates an output waveform in response to a transmitted signal with interference from the decoding circuit according to Embodiment 2 of the present invention. FIG. 5c is a partially enlarged schematic view of portion A of FIG. 5b.

As shown, the decoding circuit provided in this embodiment includes a charge/discharge unit 100, a capacitor 200, a conversion unit 300, a first reference unit 400 and a second reference unit 500. The second reference unit 500 is integrated with the first reference unit 400 as a single unit.

The first reference unit 400 includes a first current minor 410 and configured to generate a reference current I1. The charge/discharge unit 100 includes a second current minor 110, a third current minor 120 and a fourth current minor 130.

The first current minor 410 has an input for receiving the reference current I1. The first current minor 410 further has a first output (provided by a collector of a transistor Q8, as shown in FIG. 3) coupled to an input of the second current mirror 110. The second current minor 110 has an output coupled to an input of the third current minor 120. The third current minor 120 has an output coupled to the capacitor 200. The first current minor 410 further has a second output (provided by a collector of a transistor Q3, as shown in FIG. 3) coupled to an input of the fourth current minor 130. The fourth current mirror 130 has an output coupled to an output of the third current minor 120. That is, the third current mirror 120, the fourth current minor 130 and the capacitor 200 are coupled to the same node.

The magnitude of an output current I3 from the third current minor 120 is 1.9-2.1 times that of the reference current I1. The magnitude of an output current I2 from the fourth current mirror 130 is 0.95-1.05 times that of the reference current I1, and this output current I2 flows in the same direction as the output current I3 from the third current minor. More preferably, the magnitude of the output current I3 from the third current minor 120 is twice that of the reference current I1, and the magnitude of the output current I2 from the fourth current minor 130 is equal to that of the reference current I1. Moreover, the output current I2 from the fourth current minor 130 flows in the same direction as the output current I3 from the third current minor 120. This can be achieved by properly configuring parameters of components in the first current minor 410, second current minor 110, third current minor 120 and fourth current minor 130. The manner of doing this is well known in the art, and a detailed description thereof is deemed unnecessary and omitted. It is to be understood that the first current minor 410, second current minor 110, third current minor 120 and fourth current minor 130 are included to produce charge and discharge currents as designed, and those skilled in the art can devise other specific circuits that produce charge and discharge currents of the same magnitude and achieve the same beneficial effects based on common general knowledge in the art and the design concept disclosed herein. Accordingly, such circuits are also intended to be embraced within the scope of this application. It is to be understood that the purpose of the above arrangement is to achieve a ratio of charge time to discharge time in the range of 0.95-1.05, and setting the magnitude of I3 to be 1.9-2.1 times that of I1 and the magnitude of I2 to be 0.95-1.05 times that of I1 is only one example of achieving the purpose. Alternatively, similar effects can also be achieved, for example, by setting the magnitude of the output current I3 from the third current mirror 120 to be 3.9-4.1 times that of the reference current I1 and the magnitude of the output current I2 from the fourth current mirror 130 to be 1.95-2.05 times that of the reference current I1 and by causing the output current I2 from the fourth current mirror 130 to flow in the same direction as the output current I3 from the third current mirror. Accordingly, it is intended that any and all approaches that achieve a ratio of charge time to discharge time of 0.95-1.05 for the capacitor 200 through properly setting magnitudes of I3 and I2 by appropriately configuring the related components fall within the scope of this application.

Further, the inputs of the second current mirror 110, third current mirror 120 and fourth current mirror 130 are coupled to the collectors via transistors, as shown in FIG. 3 and detailed blow.

A base of a transistor Q9 providing the input of the second current mirror 110 is coupled to an emitter of an NPN transistor Q10, and a collector of the transistor Q9 is coupled to a base of the transistor Q10. In addition, a collector of the transistor Q10 is coupled to a power supply VCC.

A base of a transistor Q12 providing the input of the third current mirror 120 is coupled to an emitter of a PNP transistor Q13, and a collector of the transistor Q12 is coupled to a base of the transistor Q13. Additionally, a collector of the transistor Q13 is ground.

A base of a transistor Q4 providing the input of the fourth current mirror 130 is coupled to an emitter of an NPN transistor Q5, and a collector of the transistor Q4 is coupled to a base of the transistor Q5. Further, a collector of the transistor Q5 is coupled to the power supply VCC.

This arrangement results in increased accuracy of the current mirrors and enhanced correctness of the decoding circuit.

Specifically, in this arrangement, when the third current mirror 120 is operating, the output current I3 from the third current minor 120 converges with the output current I2 from the fourth current mirror to form the charge current I1. With the direction of I3 defined as positive, as can be seen, the charge current is positive. When the third current minor 120 is out of operation, the output current I2 from the fourth current mirror 130 alone provides the discharge current −I1. With the direction of I3 defined as positive, as can be seen, the discharge current is negative. Therefore, the charge and discharge currents are of the same magnitude but flow in opposite directions. Moreover, under the action of the current mirrors, both the charge and discharge currents are constant. In this way, a ratio of a total time required to transfer any amount of charge into the capacitor 200 to a total time required to transfer the same amount of charge from the capacitor 200 is 1.

Further, the charge/discharge unit 100 is configured to cause the third current mirror 120 to operate in response to the reception of a low level and to cause the third current mirror 120 to stop operating in response to the reception of a high level. This arrangement allows the capacitor 200 to be charged and discharged in adaption to the input signal, as part of the function of the decoding circuit provided in this embodiment. It would be appreciated that this is accomplished by coupling a collector of a transistor 140 to the input of the second current mirror 110 and taking a base of the transistor 140 as the input of the decoding circuit provided in this embodiment, as shown in FIG. 3. In other embodiments, operation of the third current minor 120 may also be controlled otherwise, e.g., by coupling an emitter of the transistor 140 to the input of the third current mirror 120, or by utilizing another circuit module with switching capabilities. All these alternatives are considered to be embraced in the scope of the present application.

As can be seen from the above description, the decoding circuit provided in this embodiment provides the same beneficial effects as the decoding circuit provided in Embodiment 1. Reference can be made to the description of Embodiment 1 for more details in this regard.

Referring to FIG. 3, the conversion unit 300 includes a voltage comparison module 310. The voltage comparison module 310 has a first input 311 coupled to the capacitor 200 and for receiving a voltage on the capacitor 200. The voltage comparison module 310 also has a second input 312 for receiving a predetermined voltage. The predetermined voltage may be provided by an external voltage supply unit 600 and may be set to a value slightly higher than 0. Reference can be made to FIG. 3 for more details in this voltage comparison module 310. In the configuration shown in FIG. 3, the voltage comparison module 310 in such a manner that it outputs a high level when the voltage received at the first input 311 is higher than the voltage received at the second input 312. Otherwise, it outputs a low level. The conversion unit 300 also includes an output module 320 having an enable terminal 321 coupled to an output of the voltage comparison module 310. When the output module 320 is configured as shown in FIG. 3, the output module 320 operates in such a manner that, when receiving the high level from the voltage comparison module 310 at the enable terminal 321, the output module 320 of the conversion unit 300 outputs a low level. Otherwise, the output module 320 of the conversion unit 300 outputs a high level. Additionally, the first current minor 410 also has a third output (provided by a collector of a transistor Q19 as shown in FIG. 3) for providing the voltage comparison module 310 with a biasing current. The first current minor 410 further has a fourth output (provided by a collector of a transistor Q24 as shown in FIG. 3) for providing the output module 320 with a biasing current. Reference can be made to FIG. 3 for more details in this regard.

FIG. 4 shows waveforms of signals in the decoding circuit of FIG. 3 with the arrangement as described above. Referring the portion of FIG. 4 encircled with the dashed box, when a pulse with a pulse width of $\Delta T$ is input to the decoding circuit as a signal indicating "01" (this pulse lasts for a total period of $2*\Delta T$ and carries two bits each corresponding to a period of $\Delta T$), a $2*\Delta T$-wide pulse is output as a signal indicative of "0". When a pulse with a pulse width of $\Delta T$ is input as a signal indicating "11" (this pulse lasts for a total period of $2*\Delta T$ and carries two bits each corresponding to a period of $\Delta T$), a $2*\Delta T$-wide pulse is output as a signal indicative of "1". Reference can be made to the description of Embodiment 1 for more details in this regard. It would be appreciated that $\Delta T$ in FIG. 4 and $\Delta T$ in FIG. 2 are each a general reference to "a certain period of time", and the two periods are not necessarily equal.

In the prior art, referring to FIG. 5a, when there is a noise spike present in an input signal, which occurs during transfer of the signal, the spike will remains in a decoded signal. This may adversely affect the operation of a subsequent circuit, or in a severe case, even lead to the subsequent circuit being logically trapped in an infinite loop and not able to normally operate anymore. By contrast, the decoding circuit of this embodiment will not be affected much in the same situation. Referring to FIGS. 5b and 5c, assuming a low-level signal starting at the time t1 and ending at t4 is input to the decoding circuit, in which there is a noise spike starting at t2 and ending at t3, and further assuming $t4-t1=\Delta T1$ and $t3-t2=\Delta T2$, the capacitor 200 will be charged in the period from t1 to t2, accumulating an amount of charge to be discharged within a period of (t2−t1). In this period, since the voltage on the capacitor 200 is higher than the predetermined voltage, the decoding circuit outputs signal indicative of "0". In the period from t2 to t3, the capacitor 200 is discharged, depleting the charge on the capacitor 200 to an amount that can be discharged within a period of (t2−t1)−(t3−t2). In this period, the voltage on the capacitor 200 remains higher than the predetermined voltage, so the decoding circuit continues outputting "0". In the period from t3 to t4, the capacitor 200 is charged, increasing the charge on the capacitor 200 to an amount that can be discharged within a period of (t2−t1)−(t3−t2)+(t4−t3). In this period, the voltage on the capacitor 200 remains higher than the predetermined voltage, so the decoding circuit continues outputting "0". In the period from t2 to t3, t4 to (t4+$\Delta T3$), the capacitor 200 is fully discharge to zero, where $\Delta T3=(t2-t1)-(t3-t2)+(t4-t3)$. In this period, the voltage on the capacitor 200 remains higher than the predetermined voltage, so the decoding circuit continues outputting "0". Subsequently, a new decoding cycle is initiated, with the decoding circuit beginning to output "1". Thus, the actual total time in which the decoding circuit outputs "0" is $t4-t1+\Delta T3=2*(t4-t1)-2*(t3-t2)=2*(\Delta T1-\Delta T2)$, $2*\Delta T2$ shorter than the expected $2*\Delta T1$. Typically, the noise spike is very narrow, and the difference $2*\Delta T2$ is thus so minor as to be ignored by a subsequent analog to digital conversion circuit/chip. Therefore, the output signal waveform from the decoding circuit is not affected by the noise spike, and although its pulse width is modified, the modification has no impact on the subsequent circuit. Thus, error correction is achieved.

Reference can be made to FIG. 3 for other details of the components or modules in the decoding circuit that are not described in this embodiment.

In summary, in the decoding circuits and chips provided in Embodiment 1 and 2, the charge/discharge unit 100, the capacitor 200 and the conversion unit 300 are connected in a sequence. The charge/discharge unit 100 is configured to charge the capacitor 200 in response to the reception of a first level and to discharge the capacitor 200 in response to the reception of a second level. A ratio of a total time required to transfer any amount of charge into the capacitor 200 to a total time required to transfer the same amount of charge from the capacitor 200 is predetermined. The conversion unit is configured to output a third level if a voltage on the capacitor 200 exceeds a predetermined voltage and to otherwise output a fourth level. The first level is one of a high level and a low level, while the second level is the other of the high and low levels. The third level is one of the high and low levels, while the fourth level is the other of the high and low levels. This design enables signal decoding by taking advantage of the encoding characteristics of the HBS protocol to control charge and discharge cycles of the capacitor, thus alleviating computational burden of an MCU. In addition, it eliminates any adverse effect of noise in a transmitted signal by taking advantage of the behavior of the capacitor 200 that the amount of charge thereon will not experience abrupt changes, allowing an extended effective transmission distance when using the HBS protocol. Further, setting the ratio of charge time to discharge time for the capacitor to a predetermined value imparts self-adaptiveness to signals transmitted at different clock rates. Thus, the problems with the prior art including heavy MCU computational burden, a tradeoff between error correction and transmission distance and insufficient adaptiveness to signals transmitted at different clock rates are solved.

The description presented above is merely that of a few preferred embodiments of the present invention and is not intended to limit the scope thereof in any sense. Any and all changes and modifications made by those of ordinary skill in the art based on the above teachings fall within the scope as defined in the appended claims.

What is claimed is:

1. A decoding circuit for decoding, in accordance with decoding rules of a home bus system (HBS) protocol, a signal transmitted using the HBS protocol, the decoding rules of the HBS protocol including decoding the signal "01" as "00" and decoding the signal "11" as "11", the decoding circuit comprising, connected in a sequence, a charge/discharge unit, a capacitor and a conversion unit, wherein the charge/discharge unit configured to charge the capacitor in response to a reception of a first level and to discharge the capacitor in response to a reception of a second level, wherein a ratio of a total time required to transfer any amount of charge into the capacitor to a total time required to transfer the same amount of charge from the capacitor is a predetermined value, the conversion unit configured to output a third level when a voltage on the capacitor exceeds a predetermined voltage and to otherwise output a fourth level, wherein the predetermined voltage is equal in magnitude to a voltage on the capacitor resulting from a noise spike in the first level, the first level being low, the second level being high, the third level being low, the fourth level being high, and the capacitor configured to eliminate any adverse effect of noise in a transmitted signal and to be self-adaptive to signals transmitted at different clock rates.

2. The decoding circuit of claim 1, wherein the predetermined value is selected from the range of 0.95-1.05.

3. The decoding circuit of claim 1, wherein the charge/discharge unit is configured to charge the capacitor at a first current, which is a constant current, and to discharge the capacitor at a second current, which is a constant current.

4. The decoding circuit of claim 3, wherein a ratio of a magnitude of the first current to a magnitude of the second current is in the range of 0.95-1.05.

5. The decoding circuit of claim 4, further comprising a first reference unit comprising a first current mirror for generating a reference current, wherein the charge/discharge unit further comprises a second current mirror, a third current mirror and a fourth current mirror, wherein the first current mirror having an input for receiving the reference current, the first current mirror having a first output coupled to an input of the second current mirror, the second current mirror having an output coupled to an input of the third current mirror, the third current mirror having an output coupled to the capacitor, the first current mirror having a second output coupled to an input of the fourth current mirror, the fourth current mirror having an output coupled to the output of the third current mirror, and the third current mirror configured to output a current that is 1.9-2.1 times in magnitude the reference current, the fourth current mirror configured to output a current, which is 0.95-1.05 times in magnitude the reference current and flows in a same direction as the current from the third current mirror.

6. The decoding circuit of claim 5, wherein the charge/discharge unit is configured to cause the third current mirror to operate in response to the reception of the first level to output the current, which then converges with the current from the fourth current mirror to form the first current, and to cause the third current mirror to stop operating in response to the reception of the second level so that the current from the fourth current mirror alone forms the second current.

7. The decoding circuit of claim 1, wherein the conversion unit comprises a voltage comparison module, the voltage comparison module having a first input for receiving the voltage on the capacitor, the voltage comparison module having a second input for receiving the predetermined voltage, the voltage comparison module configured to output a predetermined signal when the voltage received at the first input is higher than the voltage received at the second input.

8. The decoding circuit of claim 7, wherein the conversion unit further comprises an output module having an enable terminal coupled to the output of the voltage comparison module, the output module configured to output the third level when the predetermined signal is received at the enable terminal from the voltage comparison module and to otherwise output the fourth level.

9. The decoding circuit of claim 8, further comprising a second reference unit for providing the voltage comparison module and/or the output module with a biasing current.

10. A chip comprising the decoding circuit of claim 1.

* * * * *